United States Patent [19]

Koh et al.

[11] Patent Number: 5,686,337
[45] Date of Patent: Nov. 11, 1997

[54] METHOD FOR FABRICATING STACKED CAPACITORS IN A DRAM CELL

[75] Inventors: Chao-Ming Koh, Hsinchu; Rong-Wu Chien, Chyai, both of Taiwan

[73] Assignee: Vanguard International Semiconductor Corporation, Hsinchu, Taiwan

[21] Appl. No.: 587,128

[22] Filed: Jan. 11, 1996

[51] Int. Cl.$^6$ ............................................. H01L 21/8242
[52] U.S. Cl. ............................... 437/52; 437/60; 437/919
[58] Field of Search ................... 437/47, 52, 60, 437/919

[56] References Cited

U.S. PATENT DOCUMENTS

| | | | |
|---|---|---|---|
| 5,185,282 | 2/1993 | Lee et al. | 437/47 |
| 5,208,180 | 5/1993 | Gonzalez | 437/60 |
| 5,284,787 | 2/1994 | Ahn | 437/52 |
| 5,332,685 | 7/1994 | Paric et al. | 437/52 |
| 5,362,664 | 11/1994 | Jun | 437/52 |
| 5,391,511 | 2/1995 | Doan et al. | 437/49 |

*Primary Examiner*—Chandra Chaudhari
*Assistant Examiner*—Toniae M. Thomas

*Attorney, Agent, or Firm*—George O. Saile; Stephen B. Ackerman; William J. Stoffel

[57] ABSTRACT

A one mask/four etch step process to form an curved storage node for an advanced DRAM cell capacitor. A first undoped oxide layer and a second doped oxide layer are formed over associated field effect transistors on the substrate surface. Next, a photoresist pattern having an opening over the node (source) is formed over the second oxide layer. In the first etch step, the second oxide layer is isotropically etched through the opening. The isotropic etch selectively etches the second doped oxide layer thereby forming an arced electrode hole in the second oxide layer. Then in the second etch step, the first oxide layer is anisotropically etched to form the node contact hole. A first conductive layer is formed over resultant surface. A polarization layer is formed covering bottom portions of the first conductive layer but exposing the tops of the first conductive layer. In the third etch step, the exposed tops of the first conductive layer are etched off thereby defining curved bottom storage electrodes. The fourth etch removes the planarization layer and parts of the second oxide. Lastly, a dielectric layer and top plate electrode are formed over the bottom storage electrode. The novel process of this invention produces a capacitor using less masking and etch steps than conventional processes and allows closer spacing between capacitors.

29 Claims, 5 Drawing Sheets

METHOD FOR FABRICATING STACKED CAPACITORS IN A DRAM CELL

BACKGROUND OF INVENTION

1) Field of the Invention

This invention relates generally to fabrication of capacitors in a dynamic random access memory (DRAM) cell and more particularly to a method and process for fabricating stacked capacitors with a large capacitance.

2) Description of the Prior Art

Very large scale integration (VLSI) semiconductor technologies have dramatically increased the circuit density on a chip. The miniaturized devices built in and on semiconductor substrate, making up these circuits, are very closely spaced and their packing density has increased significantly. More recent advances in photolithographic techniques, such as phase-shifting masks, and self-aligning process steps have further reduced the device size and increased circuit density. This has lead to ultra large scale integration (ULSI) with minimum device dimensions less than a micrometer and more than a million transistors on a chip. With this improved integration, some circuit elements experience electrical limitation due to their down sizing.

One such circuit element experiencing electrical limitations is the array of storage cells on a dynamic random access memory (DRAM) chip. These individual DRAM storage cells, usually consisting of a single metal-oxide-semiconductor field-effect-transistor (MOS-FET) and a single capacitor are used extensively in the electronic industry for storing data. A single DRAM cell stores a bit of data on the capacitor as electrical charge. The decrease in cell capacitance caused by reduced memory cell area is a serious obstacle to increasing packing density in dynamic random access memories (DRAMs). Thus, the problem of decreased cell capacitance must be solved to achieve higher packing density in a semiconductor memory device, since decreased cell capacitance degrades read-out capability and increases the soft error rate of memory cell as well as consumes excessive power during low-voltage operation by impeding device operation.

Generally, in a 64 MB DRAM having a 1.5 µm² memory cell area employing an ordinary two dimensional stacked capacitor cell, sufficient cell capacitance cannot be obtained even though a higher dielectric constant material, e.g., tantalum oxide ($Ta_2O_5$), is used. Therefore, stacked capacitors having a three-dimensional structure have been suggested to improve cell capacitance. Such stacked capacitor include, for example double-stacked, fin-structured, cylindrical, spread-stacked, and box structured capacitors.

The following U.S. patent shows related processes and stacked capacitor structures: Lee et al., U.S. Pat. No. 5,185,282; Doan et al., U.S. Pat No. 5,391,511; Ahn, U.S. Pat. No. 5,284,787; and Jun, U.S. Pat. No. 5,362,664. However, many of the prior art methods require substantially more processing steps or/and planar structures which make the manufacturing process more complex and costly. Therefore, it is very desirable to develop processes that are as simple as possible and also provide methods for monitoring, in situ, the etch depth during processing.

There is a challenge to develop methods of manufacturing these capacitors that minimize the manufacturing costs and maximize the device yields. In particular, there is a challenge to develop a method which minimizes the number of photoresist masking operations and provide maximum process tolerance to maximize product yields. There is also a challenge to develop a stacked capacitor which is not limited in size by size the photolithographic techniques.

SUMMARY OF THE INVENTION

It is an object of the present invention to provide a method for fabricating a capacitor which has less photolithographic and etch steps than the conventional processes.

It is an object of the present invention to provide a method for fabricating a crown shaped capacitor having a high density and capacitance which has a spacing between adjacent storage nodes that is less than the lithographic resolution limits and has a self aligning node contact.

It is an object of the present invention to provide a method for fabricating a (DRAM) having capacitor with a high density and capacitance which has a four step etch process to define the storage electrode and does not use silicon nitride as an etch stop.

To accomplish the above objectives, the present invention provides a method of manufacturing a crown capacitor for a dynamic random access memory (DRAM) which has a one masking step and a four step etch process to define the storage electrode. Also, the contact node is self aligning. The method begins by forming a first undoped oxide layer and a second doped oxide layer over field effect transistors associated with the memory cell. Next, a photoresist pattern having an opening over the node (source) is formed over the second oxide layer. In the first etch step (e.g., the electrode hole forming etch), the second oxide layer is isotropically etched through the opening. The isotropic etch selectively etches the second doped oxide layer thereby forming an arced hole (called an electrode hole) in the second oxide layer. The electrode hole is defined by the cup shaped projections of the second oxide layer under the resist. Then in the second etch step (i.e., the contact hole etch), the first oxide layer is anisotropically etched to expose the source. The resist is then removed. A first conductive layer is formed over the arced projections and makes contact to the source. A planarization layer is formed covering bottom portions of the first conductive layer but exposing the first conductive layer on the tops of the projections. In the third etch step (the storage electrode defining etch), the exposed tops of the first conductive layer are etched off thereby defining arced bottom storage electrodes. In the fourth etch step (blanket etch back etch), the entire planarization layer and portions of the second oxide layer are etched away. Lastly, a dielectric layer and top plate electrode are formed over the bottom storage electrode. The novel one masking step and four etch steps of this invention produce a capacitor that is more closely spaced than the photolithographic capabilities allow and uses less masking and etch steps than conventional processes.

In a second embodiment of the present invention, after the resist layer having the first opening is formed, a starter hole is anisotrophically etched partially through the second oxide layer. The process continues as described above with the isotropic etch and the anisotropic contact hole etch. The starter hole in the second oxide layer allows a thicker second oxide layer to be used and prevents over etching of the first oxide layer in the selective isotropic electrode hole etch.

In a third embodiment of the present invention, before the blanket etch back (the fourth etch), an etch barrier mask is formed over peripheral circuits which protects the first dielectric layer over the peripheral circuits. This maintains a level surface topology across the wafer and globally planarizes the wafer surface thus increasing yields.

The highly selective isotropic electrode hole etch of the second oxide layer allows the spacing between adjacent storage nodes to be less than the lithographic limits. Also the process is self aligning for the node contact thereby provide additional accuracy and more process tolerance and higher yields. The invention's one masking step which defines both the contact node and the storage electrode (i.e., electrode hole), eliminates at least one mask step thereby making the process cheaper and increasing yields. Moreover, the third embodiment of the present invention maintains the second oxide layer thickness, thereby globally planarizating the peripheral areas at the same time that the storage electrodes are formed.

DETAILED DESCRIPTION OF THE PREFERRED EMBODIMENTS

The present invention will be described in detail with reference to the accompanying drawings. The present invention provides a method of forming a DRAM having a stacked capacitor which has small dimensions, high capacitance and is simple to manufacture. First, the process for forming the field oxide (FOX) and the field effect transistor structure as presently practiced in manufacturing DRAM cells is only briefly described in order to better understand the current invention. Next, the one mask/four etch step method to fabricate the capacitor will be described in detail.

Figure 1:
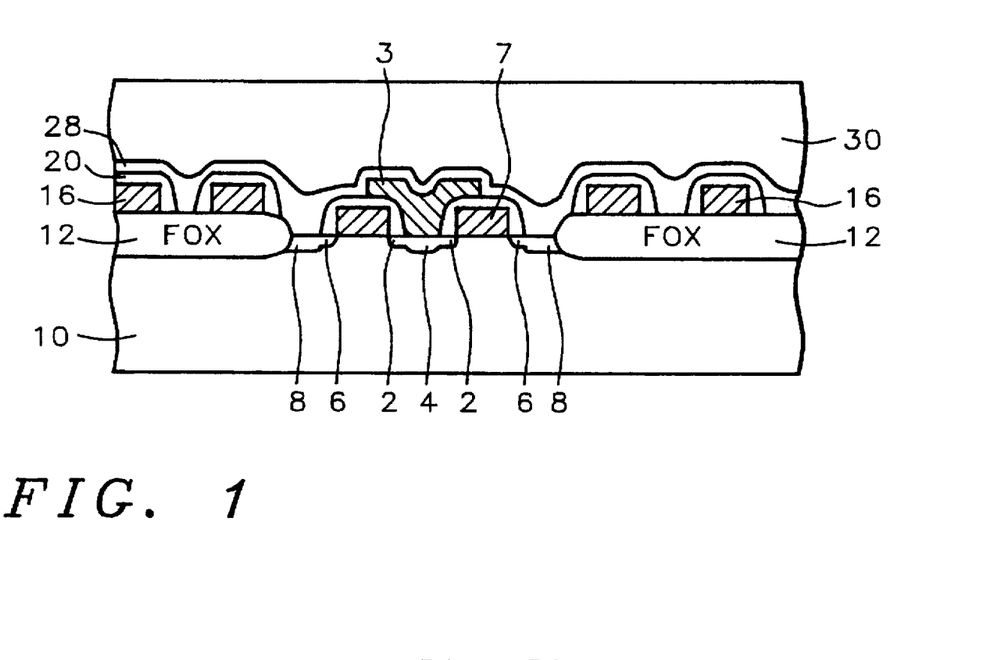
FIGS. 1 through 2 and 5 through 8 are cross sectional views for illustrating an embodiment of the method for manufacturing a DRAM having a stacked capacitor according to the present invention.

As shown in FIG. 1, the method begins by fabricating a capacitor in a substrate having a field oxide layer 12 and FET devices formed thereon. Field oxide layer 12 is formed on a semiconductor substrate 10 for defining active regions and isolation regions. The preferred substrate is composed of a P-type single crystal silicon having a (100) crystallographic orientation. A relatively thick field oxide (FOX) 12 is formed around the active device areas to electrically isolate these areas. One method of forming the field oxide regions is describe by E. Kooi in U.S. Pat. No. 3,970,486, wherein selected surface portions of a silicon substrate are masked against oxidation and the unmasked surface is oxidized to grow a thermal oxide which in effect sinks into the silicon surface at the unmasked areas. The mask is removed and semiconductor devices can be formed in the openings between the isolation regions. The preferred thickness of the field oxide being in the range of about 3000 to 6000 Å.

The semiconductor FET device is then formed in the active device area after removing the silicon nitride barrier layer and the pad oxide in a conventional wet etch. The most commonly used device for dynamic random access memory (DRAM) is MOSFET. This device is formed by first thermally oxidizing the active device area to form a thin gate oxide (not shown). The preferred thickness being from about 60 to 150 Å.

An appropriately doped polysilicon layer, and an gate insulating layer are deposited on substrate 10 and conventional photolithographic techniques are used to pattern the polysilicon layer 16, and the insulating layer 20 which comprise the gate electrodes 7. As shown in FIG. 1, gate electrodes are formed over the field oxide layer 12 and on the substrate disposed between a source 8 and a drain 4. The gates on the substrate form the gates of the MOSFET in the active device areas. The gate electrodes formed over the field oxide form word lines that electrically connect the MOSFET gates to the appropriate peripheral circuits on the DRAM chip. The lightly doped source/drain 6, 2 of the N-channel MOSFET is formed next, usually by implanting an N-type atomic species such as arsenic or phosphorus through the spaces between the gate electrodes 7. For example, a typical implant might consist of phosphorus P31 at a dose of between about 1E13 to 1E14 atoms/cm$^2$ and at an energy between about 30 to 80 Kev.

After forming the lightly doped source/drain 6, 2, sidewall spacers are formed on the gate electrode 7 sidewalls. Both the insulation layer over the gates and the spacers are shown as element 20. The sidewall spacers facing the source 8 are called inside sidewall spacers. The sidewall spacers are preferably formed by depositing a low temperature silicon oxide and anisotropically etching back to the silicon surface. For example, the silicon oxide could be a chemical vapor deposition using tetraethoxysilane (TEOS) at a temperature in the range of about 650° to 900° C. and the etch back performed in a low pressure reactive ion etcher.

The source/drain regions 8,4 of the MOSFET are now implanted between the spacers with a N type atomic species, for example, arsenic (As75), to complete the source/drain (ie., the source is the node contact) 8,4. The implantation is usually done through a thin layer of silicon oxide of about 200 to 300 Å in thickness to minimize implant channeling and to protect against contamination by metals and other impurities. A typical implantation dose being between 2E15 to 1E16 atoms/cm$^2$ and an energy of between about 20 to 70 Kev.

A polysilicon bit line 3 can be formed next. A doped polysilicon layer can be formed and patterned using conventional lithographic and etching techniques to form bit line 3 over the drain 4. Alternately, the bit line can be formed over the capacitors on a subsequent layer.

The remainder of this embodiment relates more specifically to those objects of the invention, which relate to the formation of the storage capacitor having a smaller size, an increased capacitance, and also providing a more manufacturable process.

As shown in FIG. 1, a first conformal insulation layer 28 is formed over the substrate surface and contacts the source and drain areas 8,4. The conformal insulating layer 28 can be formed of silicon nitride or silicon oxide. The conformal insulating layer 28 is preferably composed of an undoped silicon oxide formed by a low temperature chemical vapor deposition process using Tetraethylorthosilicate (TEOS). Layer 28 preferably has a thickness in the range between about 1000 to 2000 Å and more preferably about 1500 Å.

As shown in FIG. 1, a first dielectric layer 30 is formed over the substrate surface. The first dielectric layer 30 can be formed of a material selected from the group consisting of, P-doped silicon oxide (phosphosilicate glass), Boron-doped silicon oxide, borophosphosilicate glass (BPSG), and spin-on-glass. The first dielectric layer 30 (ie., second oxide layer) is preferably formed of borophosphosilicate glass formed by a conventional chemical vapor deposition process. The first dielectric layer 30 is formed by a process that yields a layer with the correct film density, porosity and composition so that the first dielectric layer is etched faster (e.g. in a Buffered HF solution or in a fluorocarbon plasma) than the undoped silicon oxide or silicon nitride insulation layer 28. The first dielectric layer 30 has a thickness in the range of between about 2000 to 6000 Å and more preferably about 4500 Å. The doped silicon oxide first dielectric layer 30 is then preferably heated to flow to planarize the layer. The thickness of layer 30 determines the height of the cylinder in the cylindrical storage electrode, which effects the cell's capacitance. Also, the first dielectric layer 30 can also be formed and etched back to the desired thickness.

Alternatively, the first dielectric layer 30 can be chemically mechanically polished (CMP). The wafer is subjected to a chemical mechanical polishing technique which is conducted to at least the point of stopping at the upper surface of layer 30. An example slurry would be the SCI slurry, available from Roden Products Corporation of Newark, Del. U.S.A. Such slurry comprises KOH, $SiO_2$ particles and water. A typical CMP polish time would be from about 1 to 2 minutes. Any residual slurry left on the wafer surface would be removed by a conventional wet cleaning technique.

Figure 2:
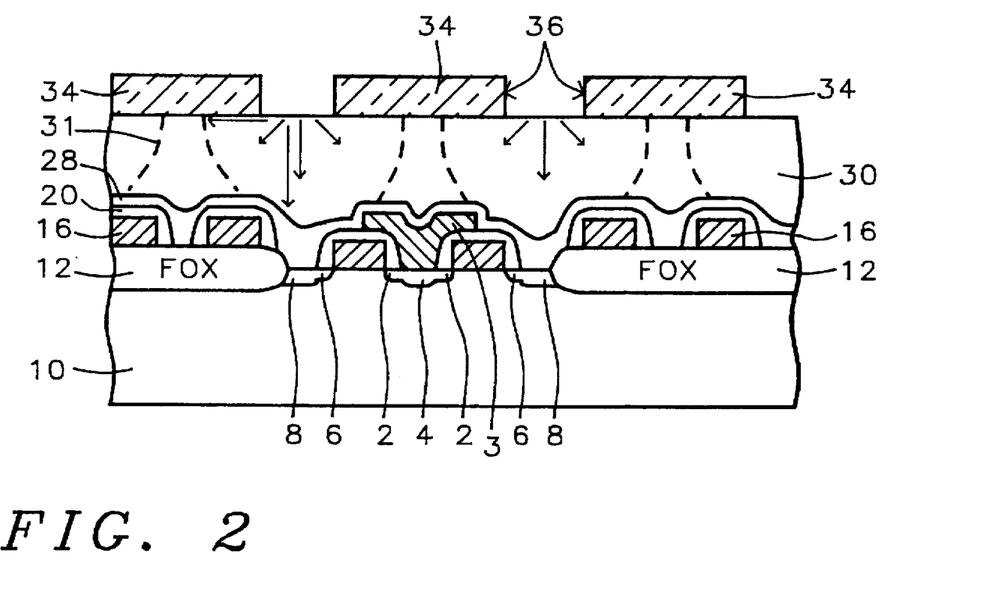

As shown in FIG. 2, a first photoresist pattern 34 having a first opening 36 over the source 8 is formed over the first dielectric layer 30. The first opening 36 preferably has a circular or rectangular shape. A rectangular first opening preferably has a length and width in the range of between about 0.35 μm to 0.6 μm.

Figure 5:
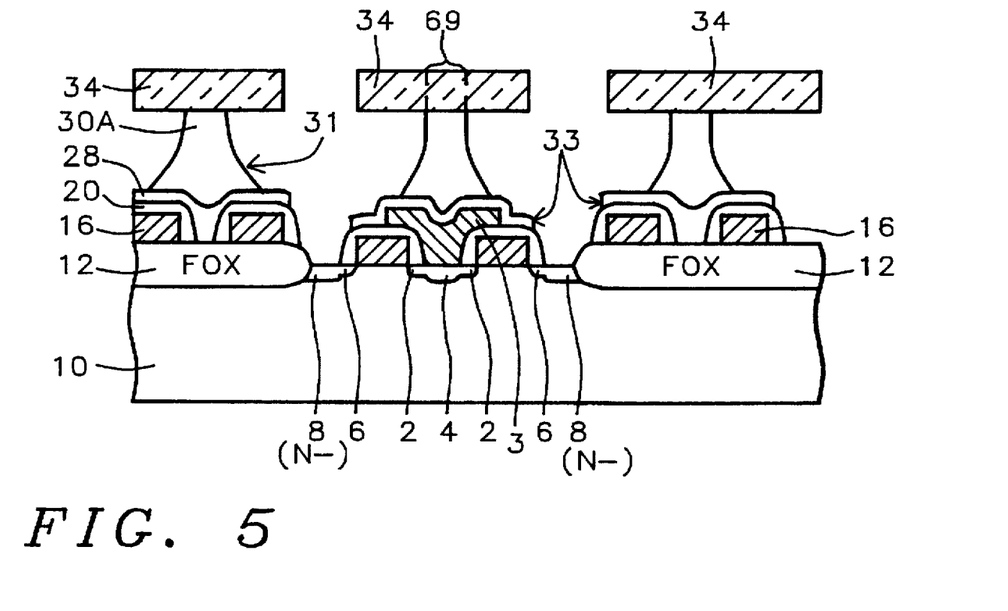

As shown in FIGS. 2 and 5 in the first isotropic etch, the first dielectric layer 30 is isotropically etched through the first opening 36 in the resist layer 34 forming the electrode hole 31. The isotropic etch has an etch rate ratio greater than 5:1 between the first insulation layer 28 and the first dielectric layer 30. The etch ratio is preferably in the range of between about 5:1 and 20:1. The different compositions of the first insulation layer (e.g., undoped oxide) and the first dielectric layer 30 (doped silicon oxide) cause the etch to selectively etch the first dielectric layer faster than the first insulation layer 28. The isotropic etch forms projections 30A of the first planarization layer. The isotropic etch removes upper portions of the first dielectric layer 30 to form an electrode hole 31 which is used to form the arced storage electrodes 42. The projections 30A can have a width 69 (see FIG. 5) in the range of between about 0.15 to 0.3 and more preferably about 0.20 μm. This is beyond the lithographic limits considering the tolerances that must be built in to compensate for overlay and misalignments.

The isotropic etch can be performed with dilute HF solution or a down stream fluorocarbon plasma. The etch must have a selectivity to etch the first dielectric layer (e.g., doped oxide) over the first insulation layer 28 (i.e., undoped oxide) to leave the first insulation layer over the MOS transistors. The etch in the HF solution is preferably for an etch time between about 5 to 10 minutes and more preferably an etch time of about 8 minutes.

As displayed in FIG. 5 in the second etch, the first dielectric layer 30 and the first insulation layer 28 are anisotropically etched through the first opening 36 forming contact hole 33 thereby exposing the source 8. The contact hole anisotropic etch can be a conventional reactive ion etch (RIE) or enhanced cyclotron resonance (ECR) process that uses fluorocarbon etchants.

Figure 3:
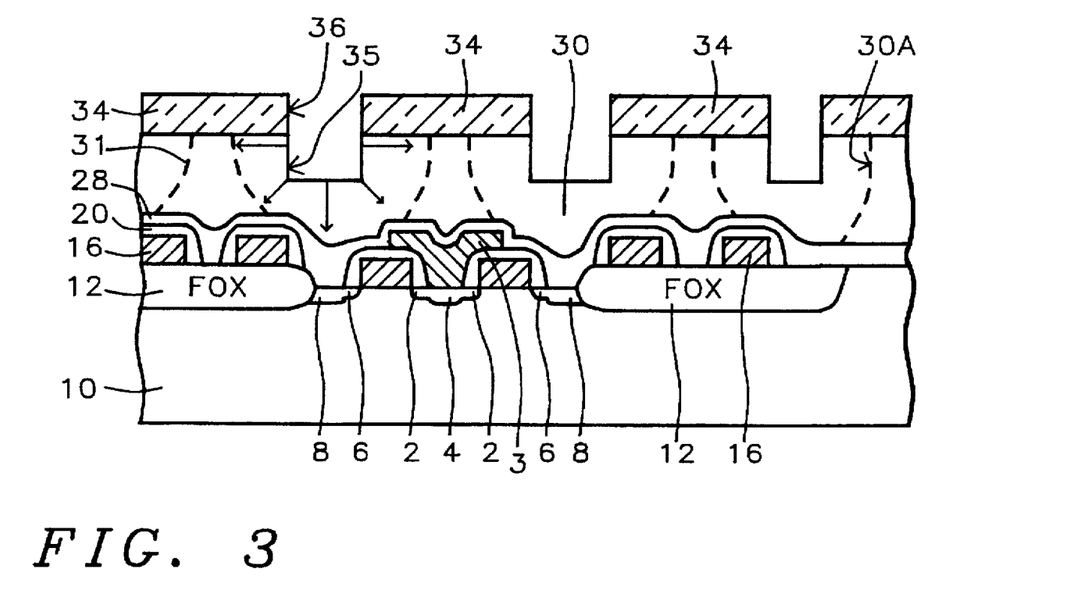
FIG. 3 is a cross sectional view illustrating the second embodiment of the present invention where starter holes 35 are formed in the second oxide layer using an anisotropic etch before the isotropic electrode hole defining etch.
Figure 4:
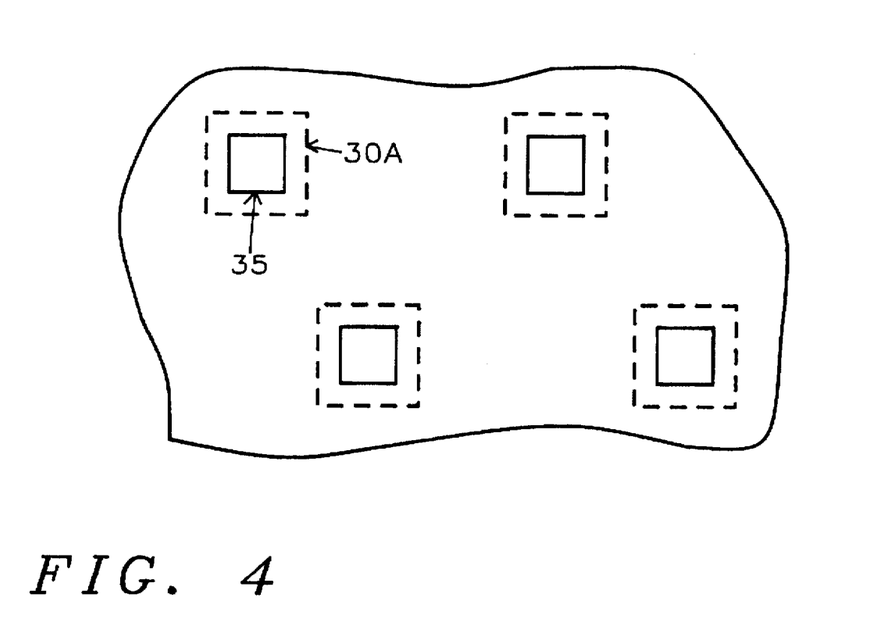
FIG. 4 is a top plan view illustrating the second embodiment of the present invention where starter holes 35 are formed in the second oxide layer using an anisotropic etch.

A second embodiment of the invention, shown in FIG. 3, includes before the first isotropic etch, an optional anisotropic etch of upper portions of the first dielectric layer 30 through the first openings 36. The anisotropic etch forms a starter hole 35 in the first planarization layer having a depth in the range of between about 2000 to 3000 Å and more preferably about 2500 Å. The optional anisotropic etch preferably uses a RIE process for a time in the range of between about 15 and 40 seconds. The starter hole 35 in the first dielectric layer 30 can be used with a thicker first dielectric layer 30 to prevent etching of the first insulation layer 28 in the selective isotropic etch. FIG. 4 shows a top down view of the second embodiment where the starter hole 35 is shown and the remaining first dielectric layer 30 is shown in dotted lines after the isotropic etch which forms the projections 30A. When the optional anisotropic etch is used to form the starter hole 35, the first dielectric layer 30 can have a thickness in the range of between about 4500 to 7000 and more preferably about 6000 Å. This thicker first planarization layer defines the height of the storage electrode thereby increasing the capacitance.

Figure 6:
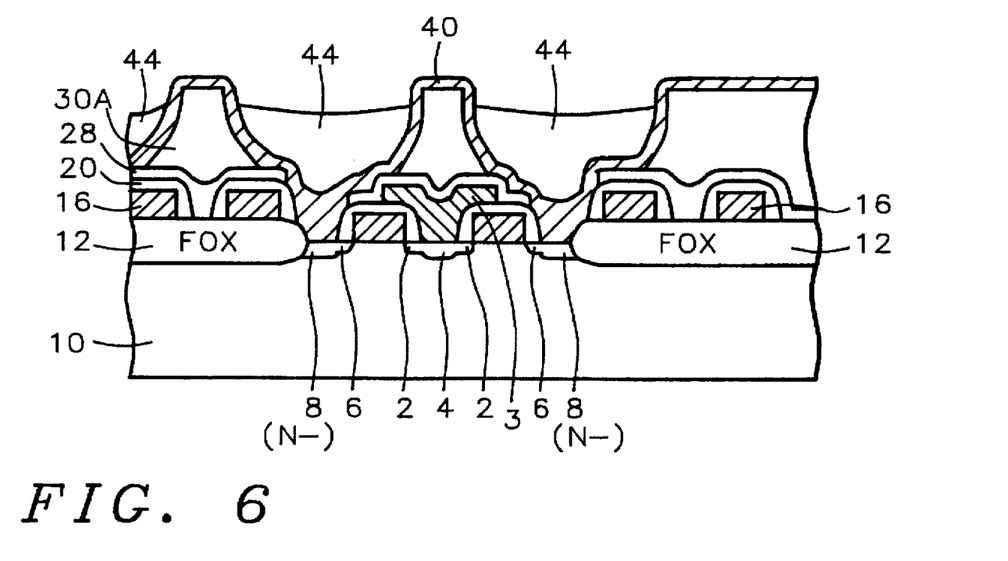

Next, the first photoresist pattern 34 is removed. As shown in FIG. 6, a first conductive layer 40 is formed over the resulting structure, including the projections 30A. The first conductive layer 40 is electrically contacted to the source 8 (ie. node).

The first conductive layer 40 can be formed of polysilicon or a polycide such as tungsten polycide. The first conductive layer is preferably doped with an impurity selected from the group consisting of phosphorus, and arsenic; and preferably has an impurity concentration in the range of between about 1E20 to 1E21 atoms/cm³ and more preferably about 5E20 atoms/cm³. The first conductive layer has a thickness in the range of between about 500 to 2000 Å and more preferably about 1000 Å. The first conductive layer can be formed by a LPCVD process using $SiH_4$ or $Si_2H_6$ and $Ph_3$ as a dopant.

A first planarization layer 44 is formed covering the first conductive layer 40. The first planarization layer 44 is formed of a material selected from the group consisting of. BPSG, spin-on-glass, and photoresist. The first planarization layer is preferably formed of spin-on-glass and preferably has a thickness in the range of between about 4000 to 6000 and more preferably about 5000 Å.

As shown in FIG. 6, the first planarization layer 44 is etched back to expose at least upper portion of the first conductive layer 40 covering the tops of projections 30A. The etch preferably uses a fluorocarbon etchant that will selectively etch the first planarization layer 44 faster than the first conductive layer 40.

Figure 6A:
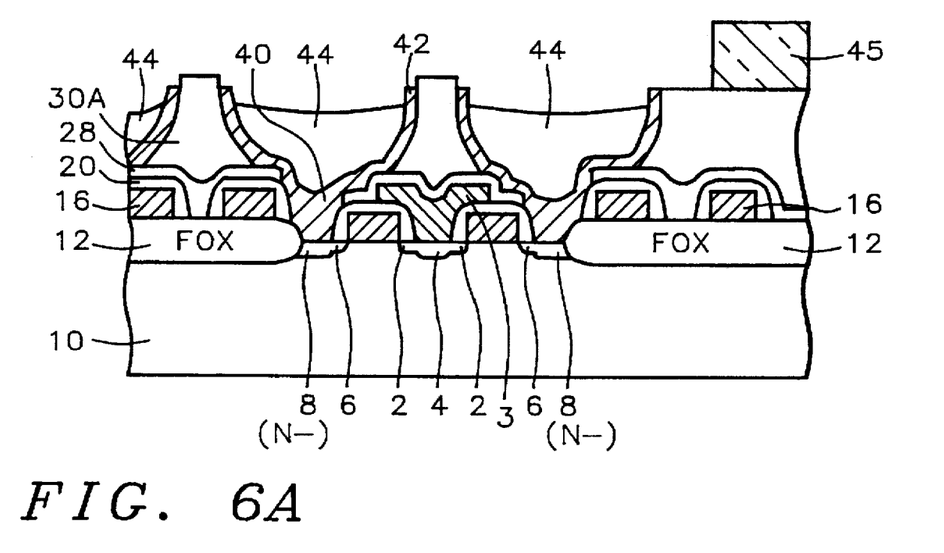
FIG. 6A is a cross sectional view illustrating the third embodiment of the present invention where an etch barrier mask is formed over the peripheral circuit areas of the substrate to mask the first dielectric layer against the blanket etch back thereby globally planarizing the substrate.

As shown in FIG. 6A in the third etch, the exposed upper portions of the first conductive layer 40 are anisotropically etched back, thereby separating the first conductive layer 40 into bottom storage electrodes 42. The etch forms an opening between the storage electrodes 42 that exposes the first dielectric layer 30 (ie. the projections 30 A). The etch back preferably uses a $CF_2$ or a $SF_6$ plasma or RIE etch. The etch back is selective to the first conductive layer. Alternatively, the first conductive layer can be chemically mechanically polished back to expose the tops of the first conductive layer.

Figure 7:
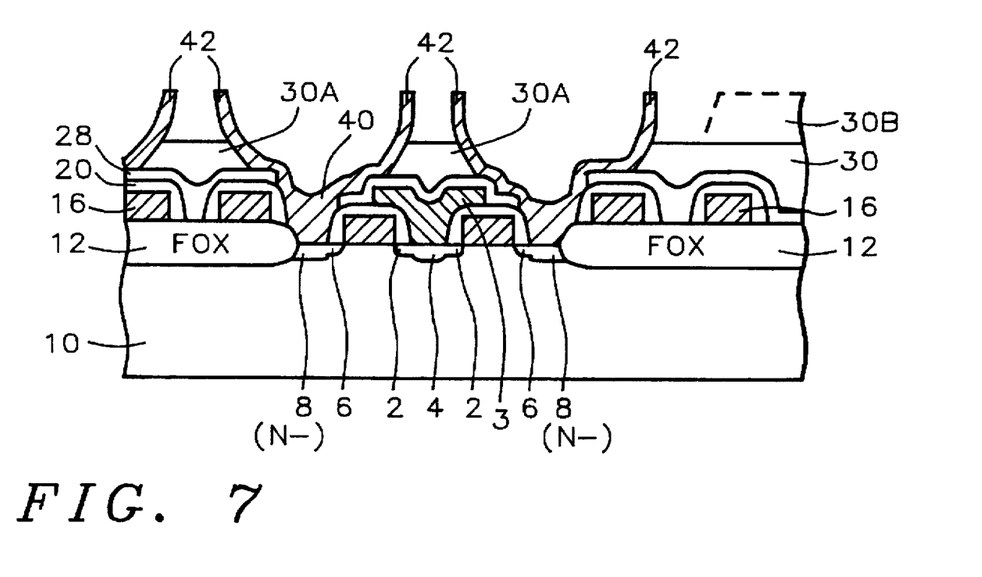

As shown in FIG. 7, the first planarization layer 44 is blanket etched to remove all of said first planarization layer 44. Also the first dielectric layer is etched to remove an upper portion of the first planarization layer 30A so that the first plantation layer 30A covers the first insulation 28 between the storage electrodes 42. The blanket etch selectively etches the first planarization layer 44 faster that the first planarization layer 30A. The blanket etch has a selectivity in the range of between about 5:1 to 20:1 between the first planarization layer (SOG) and the first dielectric layer (e.g., BPSG) and an etch ratio more preferably about 10:1. The blanket etch preferably is a 100:1 dilute HF wet etch. The blanket etch is performed for a time in the range of between about 5 to 10 minutes and more preferably about 8 minutes.

Because the blanket etch has a much higher etch rate of the first planarization layer (e.g. SOG layer) 44 than of doped first dielectric layer 30 (30A), a proper etch time can be set to remove all the first planarization layer and leave a sufficient thickness of the first dielectric layer 30A to cover the first insulation layer 28 between the storage electrodes 42.

As shown in FIG. 6A, in the third embodiment of the present invention, a photoresist layer 45 is formed over portions of the substrate that contains peripheral circuits. The photoresist layer 45 is formed after the first conductive layer has been etched and defined into storage electrodes 42 as shown in FIG. 6A. Then, the first planarization layer 44 and the exposed first dielectric layer 30 (30A) are etched as describe above. After this, the photo resist layer 45 is removed. The photoresist layer 45 preserves the first dielectric layer 30 (e.g., silicon oxide) over the peripheral circuit area thereby globally planarizing the substrate surface at the same time the storage nodes are formed. In FIG. 7, the layer 30B, shown in dashed lines, represents the additional first dielectric layer 30 over the peripheral circuits which was protected from the etch by the photoresist layer 45.

Figure 8:
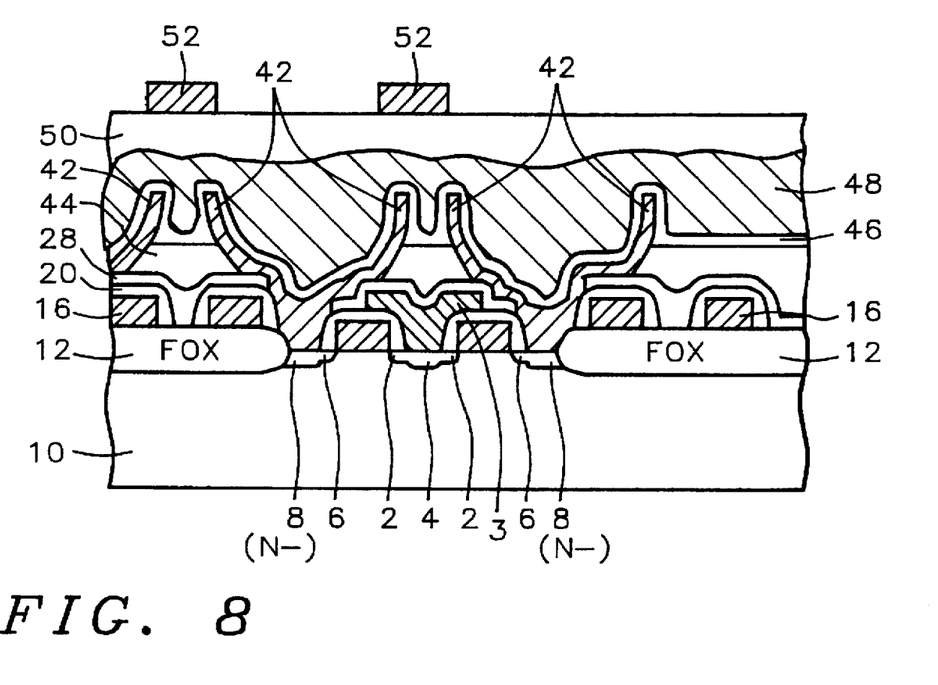

Next, a capacitor dielectric layer 46 is formed over the first electrodes 42 as shown in FIG. 8. The material of the dielectric layer 46 can be any suitable material having a high dielectric constant and being continuous and pinhole free. The conformal dielectric layer 46 can be formed of silicon nitride, an oxide/nitride/oxide (ONO) film, tantalum pentoxide ($Ta_2O_5$), $Ba_xSr_{(1-x)}TiO_3$, $PbZr_xTi_{(1-x)}O_3$, and silicon oxide material. Preferably, the conformal dielectric layer is formed of ONO. The conformal dielectric layer 46 formed of ONO preferably has at thickness in the range between about 50 to 60 Å and more preferably about 55 Å.

A top electrode 48 is formed over the capacitor dielectric layer 46 as shown in FIG. 8. This is accomplished by forming a conductive layer over the substrate surface. The conductive layer and the underlying capacitor dielectric layer 46 is masked and etched, using conventional photolithographic techniques, to form the top plate electrode 48. The top electrode 48 has a thickness in the range between about 500 to 2000 Å and more preferably about 1000 Å. The top plate electrode is preferably formed of a polycrystalline silicon doped with an impurity using an in situ process. The top plate electrode preferably has an impurity concentration in the range of between about 1E20 to 1E21 atoms/$cm^3$ and more preferably about 5E20 atoms/$cm^3$.

As shown in FIG. 8, a second insulation layer 50 is formed over the resulting structure. The second insulation layer 50 can be formed of undoped silicon oxide, phosphosilicate glass (PSG), and SOG. Also, the second insulation layer can be formed of two layers: an undoped oxide and a planarization layer, such as BPSG. Second insulation layer 50 preferably has a thickness in the range of between about 3500 to 5000 and more preferably about 4500 Å.

Next, metal lines 52 can be formed over the second insulation layer 50 as shown in FIG. 8. The metal lines 52 can function as word lines, address signal lines or power lines.

The method of the invention has many advantages over the prior art. The highly selective isotropic etch of the first dielectric layer 30 allows the spacing between adjacent storage nodes to be less than the lithographic limits. Also the process is self aligning for the node contact 33 thereby provide additional accuracy. The four step etch process eliminates at least one mask step for defining the storage node. The second embodiment of the invention (formation of the starter hole 35, FIG. 3) allows use of a thicker first insulation layer 30 and therefore taller capacitors with more capacitance. The third embodiment of the present invention (i.e., the etch barrier mask is formed over peripheral circuits) maintains a level surface topology across the wafer and globally planarizes the wafer surface thus increasing yields.

It should be well understood by one skilled in the art that by including additional process steps not described in this embodiment, other types of devices can also be included on the DRAM chip. For example, P wells in the P substrate and CMOS circuit can be formed therefrom. It should also be understood that the figures depict only one DRAM storage cell out of a multitude of cells that are fabricated simultaneously on the substrate. Also, the capacitor can be used in other chip types in addition to DRAM chips.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a capacitor of a semiconductor memory device on a substrate; said substrate having a device area with a source region formed therein, comprising the steps of:

a) forming a first insulation layer over said device area;

b) forming a first dielectric layer over said first insulation layer;

c) forming a first photoresist pattern over said first dielectric layer, said first photoresist pattern having a first opening over said source;

d) isotropically etching said first dielectric layer through said first opening; said isotropic etch forming an electrode hole defined by projections of said first dielectric layer; the isotropic etch removing at least all of said first dielectric layer under said first opening and exposing said first insulation layer; said isotropic etch having an etch rate ratio greater than 5:1 between said first dielectric layer and first insulation layer; said projections having a top surface;

e) forming a contact hole through said first insulation layer exposing said source;

f) removing said first photoresist pattern;

g) forming a first conductive layer over the resulting formed in step (e) structure; said first conductive layer being electrically connected with said source;

h) forming a first planarization layer covering said first conductive layer;

i) etching back said first planarization layer to expose at least portions of said first conductive layer covering said top surface of said projections;

j) selectively etching the exposed portions of said first conductive layer thereby separating said first conductive layer into storage electrodes and exposing said first dielectric layer between said storage electrodes;

k) blanket etching said first planarization layer to remove all of said first planarization layer and to remove portions of the exposed first dielectric layer; said blanket etch selectively etching said first planarization layer over said first dielectric layer; and l) forming a capacitor dielectric layer and a top plate electrode covering said storage electrodes.

2. The method of claim 1 which further includes after step (c), anisotropically etching upper portions of said first dielectric layer through said first opening forming a hole partially through said first dielectric layer.

3. The method of claim 1 which further includes after step (c), anisotropically etching upper portions of said first dielectric layer through said first opening forming a starter hole partially through said first dielectric layer; said starter hole having a depth in the range of between about 2000 and 3000 Å.

4. The method of claim 1 wherein said first insulation layer is formed of a material selected from the group consisting of: undoped silicon oxide and silicon nitride.

5. The method of claim 1 wherein said first insulation layer has a thickness in the range of between about 1000 to 2000 Å.

6. The method of claim 1 wherein said first dielectric layer is formed of a material selected from the group consisting of: phosphosilicate glass, and borophosphosilicate glass; and said first dielectric layer has a thickness in the range of between about 1000 to 2000 Å.

7. The method of claim 1 wherein said first dielectric layer is planarized by a method selected from the group consisting of: a chemical mechanical polishing method, a glass flow treatment, and an etch back method.

8. The method of claim 1 wherein said isotropic etch in step (d) is performed with a dilute HF wet etch for an etch time between about 5 to 10 minutes.

9. The method of claim 1 wherein said isotropic etch in step (d) is an isotropic etch having a higher etch rate of said first dielectric layer than said first insulation layer; and said isotropic etch has an etch rate ratio between about 5:1 to 20:1 between said first dielectric layer and said first insulating layer.

10. The method of claim 1 wherein said first conductive layer is formed of a material selected from the group consisting of: polysilicon and a polycide; and is doped with an impurity selected from the group consisting of: phosphorus, arsenic and has an impurity concentration in the range of between about 1E20 to 1E21 atoms/cm$^3$ and has a thickness in the range of between about 500 to 2000 Å.

11. The method of claim 1 wherein said first planarization layer is formed of a material selected from the group consisting of: spin-on-glass and photoresist.

12. The method of claim 1 wherein said capacitor dielectric layer is composed of a material selected from the group consisting of: a three layer structure of silicon oxide-silicon nitride-silicon oxide (ONO), $Ta_2O_5$, and silicon nitride; and said capacitor dielectric layer has a thickness in the range of between about 50 to 60 Å.

13. The method of claim 1 wherein said substrate further includes a peripheral circuit area and further includes after step (j), forming a peripheral circuit resist mask covering said peripheral circuit area; said peripheral circuit resist mask being an etch barrier; and after step (k) removing said peripheral circuit resist mask.

14. The method of claim 1 wherein said top electrode has a thickness in the range of between about 500 to 2000 Å.

15. The method of claim 1 further includes after step (l): forming a second insulation layer over the resulting structure.

16. A method of fabricating a dynamic random access memory (DRAM) cell having a capacitor on a substrate, comprising the steps of:

a) forming a MOS (metal oxide semiconductor) device having source and drain regions, adjacent to a field oxide region, in said substrate;

b) forming a first oxide layer composed of an undoped silicon oxide over said MOS device;

c) forming a second oxide layer composed of a doped silicon oxide over said first oxide layer; said first oxide layer and said second oxide layer having different etch characteristics;

d) forming a first photoresist pattern having a first opening over said source; and anisotropically etching upper portions of said second oxide layer through said first openings forming a starter hole partially through said second oxide layer; said starter hole having a depth in the range of between about 2000 and 3000 Å;

e) isotropically etching said second oxide layer through said first opening; said isotropic etch having an etch rate ratio between about 5:1 and 20:1 between said second oxide layer and said first oxide layer; said isotropic etch forming an electrode hole defined by projections of said second oxide layer and said first insulation layer; the isotropic etch removing at least all of said first dielectric layer under said first opening and exposing said first dielectric layer; said projections having a top surface;

f) forming a contact hole through said first oxide layer exposing said at least portions of source;

g) removing said first photoresist pattern;

h) forming a first conductive layer over the resulting structure; said first conductive layer being electrically connected with said source;

i) forming a first planarization layer composed of spin on glass covering said first conductive layer;

j) etching back said first planarization layer to expose at least portions of said first conductive layer covering said top surface of said projections;

k) selectively etching the exposed portions of said first conductive layer thereby separating said first conductive layer into storage electrodes and exposing said second oxide layer between said storage electrodes;

l) blanket etching said first planarization layer to remove all of said first planarization layer and to remove portions of said second oxide layer; said blanket etch selectively etching said first planarization layer over said second oxide layer; said blanket etch has an etch selectivity greater than 5:1 for said first planarization layer over said second oxide layer; and m) forming a capacitor dielectric layer and a top plate electrode covering said storage electrodes.

17. The method of claim 16 wherein said first oxide layer has a thickness in the range of between about 1000 to 2000 Å.

18. The method of claim 16 wherein said second oxide layer is formed of a material selected from the group consisting of: phosphosilicate glass, and borophosphosilicate glass; and said second oxide layer has a thickness in the range of between about 1000 to 2000 Å.

19. The method of claim 16 wherein said second oxide layer is planarized by a method selected from the group consisting of: a chemical mechanical polishing method, a glass flow treatment, and an etch back method.

20. The method of claim 16 wherein said isotropic etch in step (d) is performed with a dilute HF wet etch for an etch time between about 5 to 10 minutes.

21. The method of claim 16 wherein said first conductive layer is formed of a material selected from the group consisting of: polysilicon and a polycide; and is doped with an impurity selected from the group consisting of: phosphorus, arsenic and has an impurity concentration in the range of between about 1E20 to 1E21 atoms/cm$^3$ and has a thickness in the range of between about 500 to 2000 Å.

22. The method of claim 16 wherein said first planarization layer is formed of photoresist.

23. The method of claim 16 wherein the blanket etch in step (l) has a higher etch rate of said first planarization layer than said second oxide layer; and said blanket isotropic etch has an etch rate ratio between about 5:1 to 20:1 between said first planarization layer and said second oxide layer.

24. The method of claim 16 wherein said substrate further includes a peripheral circuit area and further includes after step (k), forming a peripheral circuit resist mask covering said peripheral circuit area; said peripheral circuit resist mask being an etch barrier; and after step (l) removing said peripheral circuit resist mask.

25. The method of claim 16 wherein said capacitor dielectric layer is composed of a material selected from the group consisting of: silicon oxide-silicon nitride-silicon oxide (ONO), Ta$_2$O$_5$, and silicon nitride; said conformal dielectric layer has a thickness in the range of between about 50 to 60 Å.

26. The method of claim 16 wherein said top electrode has a thickness in the range of between about 500 to 2000 Å.

27. A method of fabricating a dynamic random access memory (DRAM) cell having a capacitor on a substrate, said substrate including peripheral circuits areas; comprising the steps of:

a) forming a MOS (metal oxide semiconductor) device having source and drain regions, adjacent to a field oxide region, in said substrate;

b) forming a first oxide layer composed of an undoped silicon oxide over said MOS device;

c) forming a second oxide layer composed of a doped silicon oxide over said first oxide layer; said first oxide layer and said second oxide layer having different etch characteristics;

d) forming a first photoresist pattern over said second oxide layer, said first photoresist pattern having a first opening over said source;

e) anisotropically etching upper portions of said second oxide layer through said first opening forming a starter hole partially through said second oxide layer;

f) isotropically etching said second oxide layer through said first opening; said isotropic etch having an etch rate ratio greater than 5:1 between said second oxide layer and said first oxide layer; said isotropic etch forming an electrode hole defined by projections of said second oxide layer; said projections having a top surface;

g) forming a contact hole through said first oxide layer exposing said source;

h) removing said first photoresist pattern;

i) forming a first conductive layer over the resulting formed in step g) structure; said first conductive layer being electrically connected with said source;

j) forming a first planarization layer composed of spin on glass covering said first conductive layer;

k) etching back said first planarization layer to expose at least portions of said first conductive layer covering said top surface of said projections;

l) selectively etching the exposed portions of said first conductive layer thereby separating said first conductive layer into storage electrodes and exposing said second oxide layer between said storage electrodes;

m) forming a peripheral circuit resist mask covering said peripheral circuit area; said peripheral circuit resist mask being an etch barrier;

n) blanket etching said first planarization layer through said peripheral circuit resist mask to remove said first planarization layer and to remove portions of said second oxide layer; said blanket etch selectively etching said first planarization layer over said second oxide layer; said blanket etch has an etch selectivity greater than 5:1 for said first planarization layer over said second oxide layer; removing said peripheral circuit resist mask; and p) forming a capacitor dielectric layer and a top plate electrode covering said storage electrodes.

28. A method of fabricating a capacitor of a semiconductor memory device on a substrate; comprising the steps of:

a) providing a substrate said substrate having a device area with a source region formed therein said substrate; said substrate having a peripheral circuit area;

b) forming a first insulation layer over said device area;

c) forming a first dielectric layer over said first insulation layer;

d) forming a first photoresist pattern over said first dielectric layer, said first photoresist pattern having a first opening over said source;

e) isotropically etching said first dielectric layer through said first opening; said isotropic etch forming an electrode hole defined by projections of said first dielectric layer; said isotropic etch having an etch rate ratio greater than 5:1 between said first dielectric layer and first insulation layer; said projections having a top surface;

f) forming a contact hole through said first insulation layer exposing said source;

g) removing said first photoresist pattern;

h) forming a first conductive layer over the resulting formed in step f) structure; said first conductive layer being electrically connected with said source;

i) forming a first planarization layer covering said first conductive layer;

j) etching back said first planarization layer to expose at least portions of said first conductive layer covering said top surface of said projections;

k) selectively etching the exposed portions of said first conductive layer thereby separating said first conductive layer into storage electrodes and exposing said first dielectric layer between said storage electrodes;

l) forming a peripheral circuit resist mask covering said peripheral circuit area; said peripheral circuit resist mask being an etch barrier;

m) blanket etching said first planarization layers to remove all of said first planarization layer and to remove portions of the exposed first dielectric layer; said blanket etch selectively etching said first planarization layer over said first dielectric layer; and removing said peripheral circuit resist mask and o) forming a capacitor dielectric layer and a top plate electrode covering said storage electrodes.

29. A method of fabricating a dynamic random access memory (DRAM) cell having a capacitor on a substrate, comprising the steps of:

a) providing a substrate having a peripheral circuit area;

b) forming a MOS (metal oxide semiconductor) device having source and drain regions, adjacent to a field oxide region, in said substrate;

c) forming a first oxide layer composed of an undoped silicon oxide over said MOS device;

d) forming a second oxide layer composed of a doped silicon oxide over said first oxide layer; said first oxide layer and said second oxide layer having different etch characteristics;

e) forming a first photoresist pattern over said second oxide layer, said first photoresist pattern having a first opening over said source;

f) isotropically etching said second oxide layer through said first opening; said isotropic etch having an etch rate ratio greater than 5:1 between said second oxide layer and said first oxide layer; said isotropic etch forming an electrode hole defined by projections of said second oxide layer; said projections having a top surface;

g) forming a contact hole through said first oxide layer exposing said source;

h) removing said first photoresist pattern;

i) forming a first conductive layer over the resulting structure; said first conductive layer being electrically connected with said source;

j) forming a first planarization layer composed of spin on glass covering said first conductive layer;

k) etching back said first planarization layer to expose at least portions of said first conductive layer covering said top surface of said projections;

l) selectively etching the exposed portions of said first conductive layer thereby separating said first conductive layer into storage electrodes and exposing said second oxide layer between said storage electrodes;

m) forming a peripheral circuit resist mask covering said peripheral circuit area; said peripheral circuit resist mask being an etch barrier;

n) blanket etching said first planarization layer to remove all of said first planarization layer and to remove portions of said second oxide layer; said blanket etch selectively etching said first planarization layer over said second oxide layer; said blanket etch has an etch selectivity greater than 5:1 for said first planarization layer over said second oxide layer;

o) removing said peripheral circuit resist mask; and p) forming a capacitor dielectric layer and a top plate electrode covering said storage electrodes.

* * * * *